(12) United States Patent
Gemma

(10) Patent No.: US 10,200,020 B2
(45) Date of Patent: Feb. 5, 2019

(54) SEMICONDUCTOR DEVICE AND ELECTRONIC DEVICE

(71) Applicant: Renesas Electronics Corporation, Tokyo (JP)

(72) Inventor: Kazuaki Gemma, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/995,967

(22) Filed: Jan. 14, 2016

(65) Prior Publication Data

US 2016/0294374 A1    Oct. 6, 2016

(30) Foreign Application Priority Data

Mar. 30, 2015 (JP) .................................. 2015-070420

(51) Int. Cl.
*H03K 5/135* (2006.01)

(52) U.S. Cl.
CPC ..................... *H03K 5/135* (2013.01)

(58) Field of Classification Search
USPC .................. 327/115, 117, 119, 291, 293, 298
See application file for complete search history.

(56) References Cited

U.S. PATENT DOCUMENTS 5,684,418 A * 11/1997 Yanagiuchi ............... G06F 1/08
327/115
6,148,225 A * 11/2000 Kestler ................. B06B 1/0284
600/411
6,466,073 B1 * 10/2002 Yukinari .................... G06F 1/08
327/115
7,183,830 B2    2/2007 Kim et al.
7,649,420 B2 * 1/2010 Chuang ..................... G06F 1/08
327/156

(Continued)

FOREIGN PATENT DOCUMENTS

JP    H 05-143753 A    6/1993
JP    H07-141063 A    6/1995

(Continued)

OTHER PUBLICATIONS

Japanese Office Action dated Aug. 7, 2018 in corresponding Japanese Patent Application No. 2015-070420, with and English translation thereof.

*Primary Examiner* — An Luu
(74) *Attorney, Agent, or Firm* — McGinn LP Law Group, PLLC.

(57) ABSTRACT

A semiconductor device has a clock signal generation circuit that generates a clock signal, and a processing circuit that operates in accordance with the clock signal. The semiconductor device can also include an external terminal and a power source terminal that is coupled to the processing circuit. The clock signal generation circuit changes the frequency of the clock signal to be generated in accordance with the voltage value of a current consumption signal supplied to the external terminal. Further, the voltage value of the current consumption signal is changed in accordance with current consumption flowing in the power source terminal. The clock signal generation circuit can change the frequency of the clock signal to be generated in accordance with a value of an analog signal supplied to the external terminal.

21 Claims, 6 Drawing Sheets

(56) References Cited

U.S. PATENT DOCUMENTS

| | | | | |
|---|---|---|---|---|
| 7,724,059 B2* | 5/2010 | Kapur | ........................ | G06F 1/06 327/115 |
| 8,253,449 B2* | 8/2012 | Seki | .......................... | G06F 1/08 327/115 |
| 8,737,453 B2 | 5/2014 | Toriyama et al. | | |

FOREIGN PATENT DOCUMENTS

| | | |
|---|---|---|
| JP | H10-124168 A | 5/1998 |
| JP | 4373370 B2 | 11/2009 |
| JP | 2012-108729 A | 6/2012 |

* cited by examiner

FIG. 3
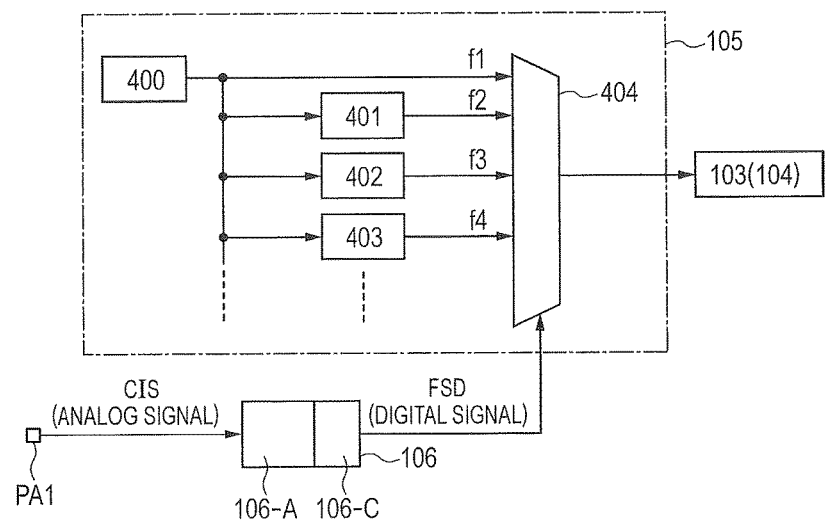
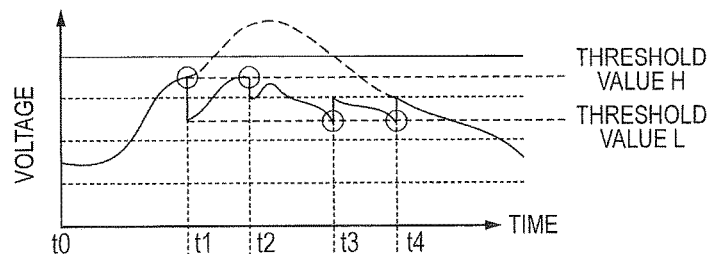
FIG. 4A
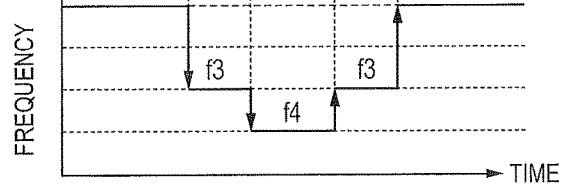
FIG. 4B

FIG. 7
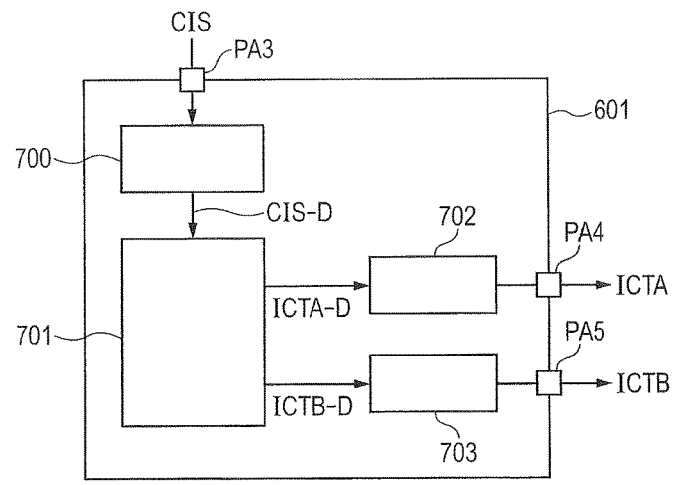
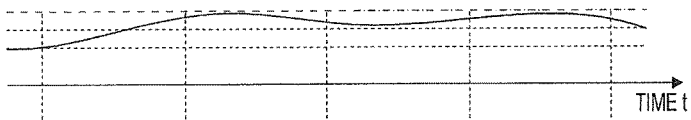
FIG. 8A  TOTAL CURRENT CONSUMPTION $Icc = (IccA + IccB)$
FIG. 8B  CURRENT CONSUMPTION $IccA$
FIG. 8C  $V_{cc}$ ICTA $V_{ss}$
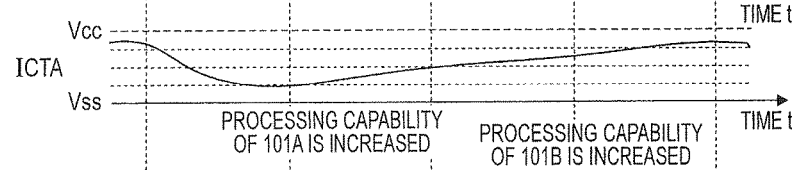
PROCESSING CAPABILITY OF 101A IS INCREASED    PROCESSING CAPABILITY OF 101B IS INCREASED
FIG. 8D  CURRENT CONSUMPTION $IccB$
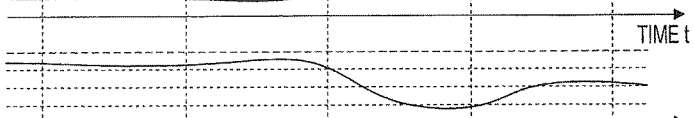
FIG. 8E  $V_{cc}$ ICTB $V_{ss}$
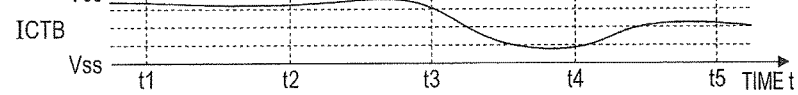
t1   t2   t3   t4   t5   TIME t FIG. 11
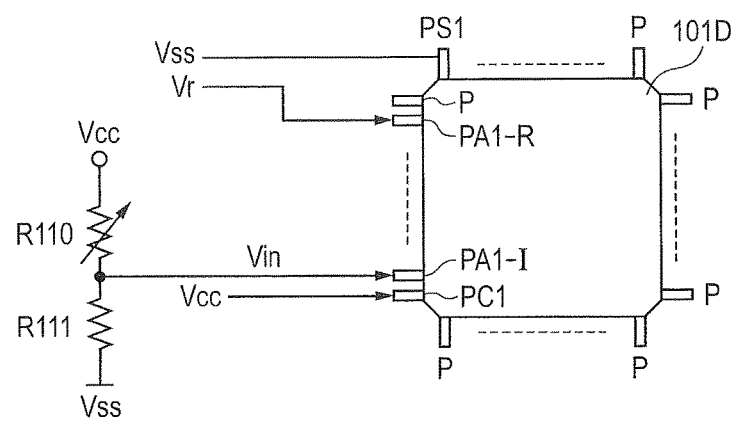
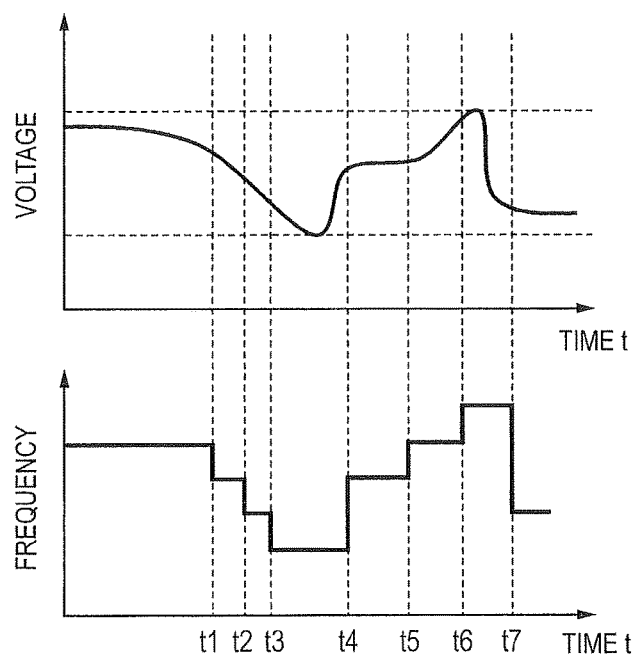
FIG. 12A
FIG. 12B

SEMICONDUCTOR DEVICE AND ELECTRONIC DEVICE

CROSS-REFERENCE TO RELATED APPLICATIONS

The disclosure of Japanese Patent Application No. 2015-070420 filed on Mar. 30, 2015 including the specification, drawings and abstract is incorporated herein by reference in its entirety.

The present invention relates to a semiconductor device, and particularly to a semiconductor device having a clock generation circuit and an electronic device including the semiconductor device.

As a semiconductor device having a clock generation circuit, for example, there is a microcomputer or the like. High performance and advanced functions have been more required for such a semiconductor device. Further, a manufacturing process of manufacturing the semiconductor device has been refined in order to realize low cost while responding to these demands. High performance and/or advanced functions have led to an increase in an operation current generated when the semiconductor device is operated. Further, along with the refining of the semiconductor manufacturing process, a leak current in the semiconductor device has been also increased.

In each of Japanese Unexamined Patent Application Publication No. 2012-108729, Japanese Unexamined Patent Application Publication No. Hei 5(1993)-143753, and Japanese Patent No. 4373370, described is a technique related to a circuit that is operated using a clock signal.

SUMMARY

Along with high performance, advanced functions, and the refining of a manufacturing process, an operation current and a leak current are increased. Specifically, current consumption including the operation current and the leak current is increased. Further, a semiconductor device such as a microcomputer is operated in accordance with a clock signal generated by a clock generation circuit. Therefore, the speed of a process in the semiconductor device can be made faster by increasing the frequency of the clock signal. However, an increase in the frequency of the clock signal leads to an increase in the operation current. Accordingly, the maximum current consumption of the semiconductor device tends to be increased in accordance with an increase in the frequency of the clock signal.

A power source voltage is supplied from a power source circuit provided outside the semiconductor device, and the semiconductor device is operated by the supplied power source voltage. In order to stably operate the semiconductor device, even when the current consumption of the semiconductor device reaches the maximum current consumption, the power source circuit needs to supply the power source voltage required for the semiconductor device. For example, in the case where the power source voltage supplied from the power source circuit to the semiconductor device is lowered when the current consumption of the semiconductor device reaches the maximum current consumption, the operation of the semiconductor device becomes unstable, and there is a concern about a malfunction.

On the other hand, the current consumption of the semiconductor device is changed due to the surrounding environment where the semiconductor device is placed and variation in manufacturing of the semiconductor device. For example, when the ambient temperature is changed, the leak current is changed. Thus, the current consumption of the semiconductor device is changed. Therefore, it is difficult to estimate the maximum current consumption of the semiconductor device in advance. Further, it is also difficult to control the value of the maximum current consumption.

An electronic device that provides a predetermined function is configured using a plurality of electronic parts and a power source circuit. As the electronic parts, used are a semiconductor device, a resistive element, a capacitive element, a transistor, and the like, and the power source circuit supplies the power source voltage to these electronic parts. For example, in order to provide a predetermined function faster, the electronic device is operated in a state where the current consumption is almost maximized (maximum allowable current). In this case, only controlling of the current consumption of a single semiconductor device is insufficient to provide an electronic device that is stably operated at a higher speed.

Japanese Unexamined Patent Application Publication No. 2012-108729 describes a technique related to a system in which electric power is supplied from a magnetic field. Japanese Unexamined Patent Application Publication No. Hei 5(1993)-143753 describes a technique of controlling a clock frequency by comparing a power source voltage with a reference voltage. Further, Japanese Patent No. 4373370 describes a technique of adjusting the frequency of a clock signal while stably keeping an internal power source voltage.

However, in Japanese Unexamined Patent Application Publication No. 2012-108729, Japanese Unexamined Patent Application Publication No. Hei 5(1993)-143753, and Japanese Patent No. 4373370, controlling of a clock generation circuit included in the semiconductor device from the outside of the semiconductor device is not recognized.

The other objects and novel features will become apparent from the description of the specification and the accompanying drawings.

According to an embodiment, a semiconductor device includes a clock signal generation circuit, a processing circuit that is operated in accordance with a clock signal generated by the clock signal generation circuit, an external terminal, and a power source terminal. The frequency of the clock signal generated by the clock signal generation circuit is controlled by an analog signal supplied to the external terminal.

The frequency of the clock signal that operates the processing circuit is controlled by the analog signal supplied to the external terminal, and thus the current consumption of the semiconductor device can be controlled from the outside of the semiconductor device.

Further, according to another embodiment, provided is an electronic device including a plurality of electronic parts and a power source circuit. The power source circuit includes a current consumption signal generation circuit that outputs an analog signal in accordance with a current flowing in the electronic parts. Further, one of the electronic parts is a semiconductor device. The semiconductor device includes a clock signal generation circuit and a processing circuit that is operated in accordance with a clock signal generated by the clock signal generation circuit. The frequency of the clock signal generated by the clock signal generation circuit is controlled by an analog signal output from the power source circuit.

The frequency of the clock signal is controlled in accordance with the current flowing in the electronic parts. Thus, for example, when the current consumption of the electronic device is increased, the current consumption of the semiconductor device can be controlled so as to be decreased.

According to an embodiment, it is possible to provide a semiconductor device that can be stably operated.

BRIEF DESCRIPTION OF THE DRAWINGS

FIG. 3 is a block diagram for showing a configuration of a clock signal generation circuit according to the first embodiment;

FIGS. 4A and 4B are waveform diagrams each showing an operation of an electronic device 100 according to the first embodiment;

FIG. 7 is a block diagram for showing a configuration of a current distribution control circuit according to the second embodiment;

FIGS. 8A to 8E are waveform diagrams each showing an operation of the electronic device according to the second embodiment;

FIG. 11 is a block diagram for showing a configuration of a semiconductor device according to a fourth embodiment; and FIGS. 12A and 12B are waveform diagrams each showing an operation of the semiconductor device according to the fourth embodiment.

DETAILED DESCRIPTION

Figure 1:
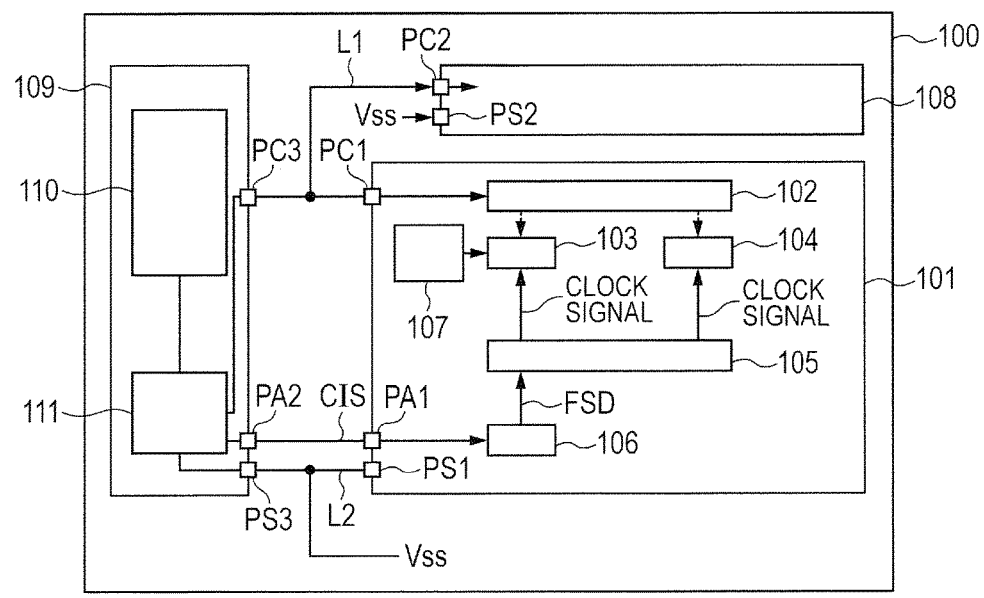
FIG. 1 is a block diagram for showing a configuration of an electronic device according to a first embodiment.

Hereinafter, embodiments of the present invention will be described in detail on the basis of the drawings. It should be noted that the same constitutional elements are given the same reference numerals in principle in the all drawings for explaining the embodiments, and the repeated explanation thereof will be omitted in principle.

First Embodiment

FIG. 1 is a block diagram for showing a configuration of an electronic device according to a first embodiment. With reference to FIG. 1, a configuration of the electronic device according to the first embodiment, a power source circuit configuring the electronic device, and a configuration of a semiconductor device as an electronic part will be described.
<Configuration of Electronic Device and Outline of Power Source Circuit and Semiconductor Device>

First, a configuration of the electronic device will be described. In FIG. 1, the reference numeral 100 denotes an electronic device; 101 and 108, electronic parts; and 109, a power source circuit. The electronic device 100 is configured by combining the electronic parts 101 and 108 with each other so as to execute a predetermined function or process. Further, the power source circuit 109 that supplies a power source voltage Vcc and a ground voltage Vss to each of the electronic parts 101 and 108 is provided at the electronic device 100 so as to operate the electronic parts 101 and 108. It is obvious that the number of electronic parts is not limited to two, but may be three or more. Further, as the power source voltage Vcc, a plurality of power source voltages whose voltage values are different from each other may be supplied to the electronic parts 101 and 108 from the power source circuit 109.

In the first embodiment, the electronic part 101 is a semiconductor device, and the electronic part 108 may be a semiconductor device, a resistive element, a capacitive element, a transistor, or a circuit obtained by combining these elements with each other. The embodiment will be described using an example in which the semiconductor device (hereinafter, the reference numeral of the semiconductor device is 101) that is the electronic part 101 is a microcomputer.

The semiconductor device 101 is not particularly limited, but includes one semiconductor chip, a package obtained by sealing the semiconductor chip, and a plurality of external terminals provided at the package. A plurality of circuit blocks, to be described later, is formed at the semiconductor chip using a well-known semiconductor manufacturing process. An input or output of each circuit block is coupled to the external terminal provided at the package. Further, each of the circuit blocks is coupled to the external terminal (power source terminal) to which the power source voltage Vcc is supplied and the external terminal (ground terminal) to which the ground voltage Vss is supplied among those provided at the package.

In FIG. 1, the external terminal to which the power source voltage Vcc is supplied is represented as PC1, and the external terminal to which the ground voltage Vss is supplied is represented as PS1. Each of the circuit blocks is operated using the power source voltage Vcc and the ground voltage Vss supplied to the external terminals PC1 and PS1, respectively, as operating voltages. Further, in FIG. 1, PA1 denotes one external terminal among those provided at the package, and a current consumption signal CIS is supplied from the power source circuit 109 to the external terminal PA1. It should be noted that the semiconductor device has other external terminals than those described above, but the external terminals are omitted in FIG. 1.

In FIG. 1, PC2 and PS2 denote a power source terminal and a ground terminal provided at the electronic part 108, respectively. The power source voltage Vcc is supplied to the power source terminal PC2, and the ground voltage Vss is supplied to the ground terminal PS2. The electronic part 108 is also operated using the power source voltage Vcc and the ground voltage Vss supplied to the power source terminal PC2 and the ground terminal PS2, respectively, as operating voltages. It should be noted that the electronic part 108 and the semiconductor device 101 are coupled to each other through signal lines, and signals are mutually transmitted and received therebetween. However, the signal lines are omitted in FIG. 1.

The power source circuit 109 includes a power source supply terminal PC3, a ground supply terminal PS3, and a terminal PA2 that outputs the current consumption signal CIS. The power source circuit 109 outputs the power source voltage Vcc from the power source supply terminal PC3 and outputs the ground voltage Vss from the ground supply terminal PS3. The power source supply terminal PC3 of the power source circuit 109, the power source terminal PC1 of the semiconductor device 101, and the power source terminal PC2 of the electronic part 108 are electrically coupled to each other through a power source line L1. As similar to the above, the ground supply terminal PS3 of the power source circuit 109, the ground terminal PS1 of the semiconductor device 101, and the ground terminal PS2 of the electronic part 108 are electrically coupled to each other through a power source line L2. Specifically, the power source voltage Vcc is supplied from the power source circuit 109 to each of the semiconductor device 101 and the electronic part 108 through the power source line L1, and the ground voltage Vss is supplied from the power source circuit 109 to each of the semiconductor device 101 and the electronic part 108 through the power source line L2.

In the first embodiment, the power source circuit 109 includes a power source voltage supply circuit 110 that forms the power source voltage Vcc and the ground voltage Vss, and a current consumption signal generation circuit 111. The power source voltage supply circuit 110 may be configured using a battery, or a step-down circuit that steps down a commercial power source. The power source voltage supply circuit 110 outputs, for example, a voltage of 3.3V or 5V relative to the ground voltage Vss as the power source voltage Vcc.

The current consumption signal generation circuit 111 is coupled between the power source voltage supply circuit 110, the power source supply terminal PC3, and the ground supply terminal PS3. Although an example of the current consumption signal generation circuit 111 will be described later using FIG. 2, the current consumption signal generation circuit 111 forms an analog signal that is changed in accordance with the value of a current flowing in the power source supply terminal PC3 as the current consumption signal CIS, and outputs the same from the terminal PA2. The power source supply terminal PC3 is coupled to the power source terminal PC1 of the semiconductor device (electronic part) 101 and the power source terminal PC2 of the electronic part 108 through the power source line L1. The current consumption signal generation circuit 111 forms an analog signal that is changed in accordance with total current consumption corresponding to the sum of current consumption flowing in the semiconductor device (electronic part) 101 and current consumption flowing in the electronic part 108, and outputs the same as the current consumption signal CIS. In this case, the total current consumption flowing in the semiconductor device 101 and the electronic part 108 is changed in accordance with the operation status of the semiconductor device 101 and/or the operation status of the electronic part 108. Further, the total current consumption is changed in accordance with the surrounding environment where the electronic device 100 is provided. Thus, the current consumption signal CIS output from the current consumption signal generation circuit 111 is changed in accordance with the operation statuses and/or the surrounding environments of the semiconductor device 101 and the electronic part 108 when the current consumption signal CIS is output.

<Configuration of Power Source Circuit>

Figure 2:
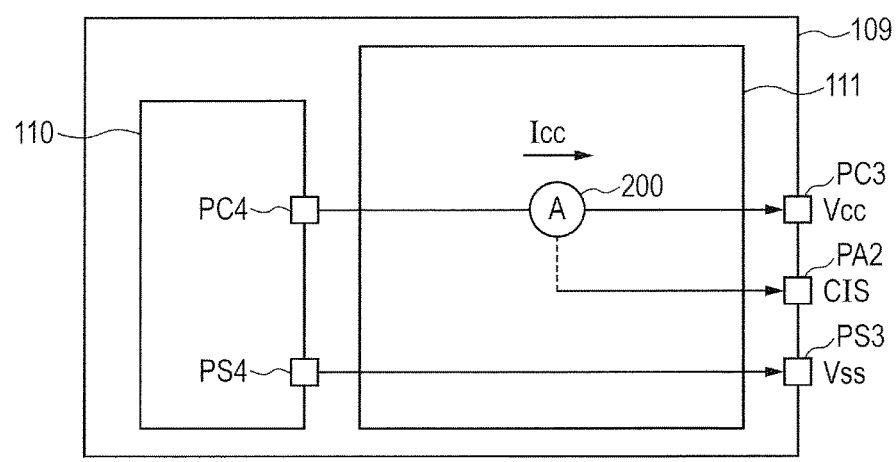
FIG. 2 is a block diagram for showing a configuration of a power source circuit according to the first embodiment.

Before explaining a configuration of the semiconductor device 101, a configuration of the power source circuit 109 will be described. FIG. 2 is a block diagram for showing a configuration of the power source circuit 109 according to the first embodiment. In FIG. 2, PC4 denotes a power source terminal of the power source voltage supply circuit 110, and PS4 denotes a ground terminal of the power source voltage supply circuit 110. The power source voltage supply circuit 110 outputs the power source voltage Vcc from the power source terminal PC4, and outputs the ground voltage Vss from the ground terminal PS4.

The current consumption signal generation circuit 111 includes an ammeter 200 that measures a current and outputs the measured result as a voltage. The ammeter 200 is coupled in series between the power source terminal PC4 and the power source supply terminal PC3, and measures total current consumption Icc flowing between the power source terminal P4 and the power source supply terminal PC3 to supply the measured result to the terminal PA2 as the current consumption signal CIS. When the current flowing in the power source supply terminal PC3, namely, the total current consumption Icc is changed with the lapse of time, the voltage value of the current consumption signal CIS is changed with the lapse of time. Specifically, the current consumption signal CIS is an analog signal whose voltage value is changed with the lapse of time.

The ground terminal PS4 of the power source voltage supply circuit 110 is electrically coupled to the ground supply terminal PS3. In FIG. 1 and FIG. 2, the ground terminal PS4 is illustrated as being coupled to the ground supply terminal PS3 through the current consumption signal generation circuit 111. However, the present invention is not limited to this.

It should be noted that the ammeter 200 can be regarded as a current/voltage conversion circuit from the point of view of converting a current into a voltage.

<Configuration of Semiconductor Device>

Next, a configuration of the semiconductor device 101 will be described using FIG. 1. In the first embodiment, the semiconductor device 101 is a microcomputer. Although the microcomputer has the circuit blocks, FIG. 1 shows only a part of the circuit blocks to avoid complication of the drawing. In FIG. 1, the reference numeral 103 denotes a microprocessor (hereinafter, also referred to as a processor) 103; 104, a peripheral circuit; and 105, a clock signal generation circuit. Further, in FIG. 1, the reference numeral 106 denotes an analog/digital conversion circuit (hereinafter, also referred to as an A/D conversion circuit) that converts an analog signal into a digital signal; 107, a memory that stores programs and the like; and 102, an internal power source circuit.

The internal power source circuit 102 is coupled to the power source terminal PC1 and the ground terminal PS1. The power source voltage Vcc is supplied from the power source terminal PC1, and the ground voltage Vss is supplied from the ground terminal PS1. The internal power source circuit 102 forms an operating voltage having a voltage value appropriate for each of the processor 103, the peripheral circuit 104, the clock signal generation circuit 105, the A/D conversion circuit 106, and the memory 107 on the basis of the power source voltage Vcc, and supplies the operating voltage to each unit. For example, the operating voltage for the processor 103 is formed by stepping down the power source voltage Vcc, and is supplied to the processor 103. In FIG. 1, only a power source line through which the operating voltage is supplied from the internal power source circuit 102 to the processor 103 and the peripheral circuit 104 is shown by a dashed line to avoid complication of the drawing, and a power source line through which the operating voltage is supplied to the other circuit blocks is omitted.

Each of the processor 103, the peripheral circuit 104, and the memory 107 is operated in synchronization with a clock signal generated by the clock signal generation circuit 105. Specifically, the processor 103 reads and executes the program stored in the memory 107 in synchronization with the clock signal generated by the clock signal generation circuit 105. In the process in which the processor 103 executes the program, the processor 103 allows the peripheral circuit 104 to be operated as needed. The peripheral circuit 104 is also operated in synchronization with the clock signal generated by the clock signal generation circuit 105. The processor 103 executes the program stored in the memory 107, and thus the function of the semiconductor device 101 is realized.

Each of the processor 103, the peripheral circuit 104, the memory 107, and the like is operated in accordance with the clock signal generated by the clock signal generation circuit 105. Accordingly, when the frequency of the clock signal generated by the clock signal generation circuit 105 is changed, the operation speeds of these circuit blocks can be changed. Each of the processor 103, the peripheral circuit 104, and the memory 107 operated in accordance with the clock signal is not particularly limited, but is regarded as a processing circuit.

In FIG. 1, only a signal line through which the clock signal generated by the clock signal generation circuit 105 is supplied to each of the processor 103 and the peripheral circuit 104 is shown to avoid complication of the drawing. However, the clock signal is also supplied to the memory 107 as described above. Further, the clock signal generated by the clock signal generation circuit 105 may be supplied to the other circuit block, for example, the internal power source circuit 102. In this case, the internal power source circuit 102 performs, for example, a step-down operation in synchronization with the supplied clock signal.

The A/D conversion circuit 106 is coupled to the external terminal PA1 and the clock signal generation circuit 105. Specifically, the current consumption signal CIS that is an analog signal is supplied to the A/D conversion circuit 106 through the external terminal PA1. The A/D conversion circuit 106 converts the current consumption signal CIS into a digital signal to form a clock selection signal FSD, and supplies the same to the clock signal generation circuit 105. The clock signal generation circuit 105 changes the frequency of the clock signal to be generated in accordance with the selection signal FSD (digital signal) from the A/D conversion circuit 106.

FIG. 3 is a block diagram for showing a configuration of the clock signal generation circuit 105 according to the first embodiment. The clock signal generation circuit 105 includes an oscillation circuit 400, a plurality of frequency divider circuits, and a selection circuit 404 controlled by the clock selection signal FSD. The clock signal generation circuit 105 includes the frequency divider circuits, but three frequency divider circuits 401 to 403 are illustrated in FIG. 3. The oscillation circuit 400 generates a clock signal having a frequency f1. The frequency divider circuit 401 is, for example, a ½ frequency divider circuit, and divides the clock signal from the oscillation circuit 400 into ½ to form a clock signal having a frequency f2 lower than the frequency f1. Further, for example, the frequency divider circuit 402 is a ⅓ frequency divider circuit, and the frequency divider circuit 403 is a ¼ frequency divider circuit. The frequency divider circuit 402 divides the clock signal from the oscillation circuit 400 into ⅓ to form a clock signal having a frequency f3 lower than the frequency f2. As similar to the above, the frequency divider circuit 403 divides the clock signal from the oscillation circuit 400 into ¼ to form a clock signal having a frequency f4 lower than the frequency f3.

The selection circuit 404 receives the clock signal (frequency f1) from the oscillation circuit 400 and the clock signals (frequencies f2 to f4) from the respective frequency divider circuits 401 to 403, and selects the clock signal having the frequency designated by the clock selection signal FSD to be supplied to the processor 103 (peripheral circuit 104). Specifically, in the first embodiment, the selection circuit 404 selects the clock signal having the frequency designated by the clock selection signal FSD that is a digital signal, and thus the frequency of the clock signal generated by the clock signal generation circuit 105 is changed. The clock signals having different frequencies such as the frequencies f1 to f4 are supplied to the selection circuit 404 in advance. Accordingly, when the frequency of the clock signal is changed, it is possible to shorten the time required to wait until the frequency of the clock signal supplied to the processing circuits such as the processor 103 and the peripheral circuit 104 is stabilized.

For example, it is conceivable that a voltage controlling oscillation circuit is used as the clock signal generation circuit 105. In this case, however, when the frequency of the clock signal is changed, phase pull-in or the like is required, and it takes time until the frequency of the clock signal supplied to the processing circuits is stabilized.

In the case where the frequencies of the clock signals that operate the processor 103 and the peripheral circuit 104 are different from each other, the selection circuit 404 selects and supplies the clock signal having the frequency suitable for each.

In the first embodiment, the A/D conversion circuit 106 includes a conversion circuit 106-A that performs analog/digital conversion, and a control circuit 106-C that forms the clock selection signal FSD on the basis of a digital signal from the conversion circuit 106-A.

The control circuit 106-C compares the digital signal from the conversion circuit 106-A with a digital signal (threshold value H) corresponding to a predetermined threshold value (threshold value H). In the case where the digital signal from the conversion circuit 106-A is larger than the digital signal (threshold value H), the clock selection signal FSD designating the clock signal having a frequency lower than the current frequency is formed and output. Further, the control circuit 106-C compares the digital signal from the conversion circuit 106-A with a digital signal (threshold value L) corresponding to a predetermined threshold value (threshold value L) In the case where the digital signal from the conversion circuit 106-A is smaller than the digital signal (threshold value L), the clock selection signal FSD designating the clock signal having a frequency higher than the current frequency is formed and output. Further, in the case where the digital signal from the conversion circuit 106-A is between the digital signal (threshold value H) and the digital signal (threshold value L), the control circuit 106-C continuously outputs the clock selection signal FSD designating the clock signal having the current frequency.

It should be noted that when the control circuit 106-C outputs the clock selection signal FSD designating the clock signal having the highest frequency and when the digital signal from the conversion circuit 106-A is smaller than the digital signal (threshold value L), the control circuit 106-C continuously outputs the clock selection signal FSD designating the clock signal having the highest frequency. As similar to the above, when the control circuit 106-C outputs the clock selection signal FSD designating the clock signal having the lowest frequency and when the digital signal from the conversion circuit 106-A is larger than the digital signal (threshold value H), the control circuit 106-C continuously outputs the clock selection signal FSD designating the clock signal having the lowest frequency.

In an initial state, for example, when the power is turned on, the control circuit 106-C outputs, for example, the clock selection signal FSD designating the clock signal having the highest frequency (f1). Accordingly, in the initial state, the selection circuit 404 selects the clock signal formed by the oscillation circuit 400 to be supplied to the processor 103 and the like. Thereafter, when the value of the current consumption signal CIS becomes higher and the digital signal from the conversion circuit 106-A becomes higher than the digital signal (threshold value H), the control circuit 106-C outputs the clock selection signal FSD designating the clock signal having the frequency (for example, f3) lower than the current frequency (f1). Accordingly, the selection circuit 404 selects the clock signal having the frequency (f3) formed by the frequency divider circuit 402 to be supplied to the processor 103 and the like.

Thereafter, the control circuit 106-C continuously outputs the clock selection signal FSD designating the clock signal having the frequency (f3) until the conversion circuit 106-A outputs a digital signal larger than the digital signal (threshold value H) or smaller than the digital signal (threshold value L). Thereafter, when the conversion circuit 106-A outputs, for example, a digital signal smaller than the digital signal (threshold value L), the control circuit 106-C outputs the clock selection signal FSD designating the clock signal having the frequency (for example, f1) higher than the current frequency (f3). Accordingly, the selection circuit 404 selects and outputs the clock signal having the frequency (f1). On the contrary, when the conversion circuit 106-A outputs, for example, a digital signal larger than the digital signal (threshold value H), the control circuit 106-C outputs the clock selection signal FSD designating the clock signal having the frequency (for example, f4) lower than the current frequency (f3). Accordingly, the selection circuit 404 selects and outputs the clock signal having the frequency (f4).

Accordingly, the frequency of the clock signal output from the clock signal generation circuit 105 is changed on the basis of the two threshold values (the threshold value H and the threshold value L) of the current consumption signal CIS. Specifically, when the current consumption signal CIS exceeds the threshold value (threshold value H), the frequency of the clock signal output from the clock signal generation circuit 105 is lowered. When the current consumption signal CIS becomes lower than the threshold value (threshold value L), the frequency of the clock signal output from the clock signal generation circuit 105 is increased. In other words, the current consumption signal CIS is determined by a comparison circuit having hysteresis, and the frequency of the clock signal from the clock signal generation circuit 105 is changed on the basis of the result of the comparison circuit.

<Operation of Semiconductor Device>

FIGS. 4A and 4B are waveform diagrams each showing operations of the electronic device 100, the current consumption signal generation circuit 111, and the semiconductor device 101 according to the first embodiment. These operations will be described using FIG. 1 to FIGS. 4A and 4B. In FIGS. 4A and 4B, each horizontal axis represents time, the vertical axis of FIG. 4A represents the voltage of the current consumption signal CIS output from the current consumption signal generation circuit 111, and the vertical axis of FIG. 4B represents the frequency of the clock signal output from the clock signal generation circuit 105. It should be noted that the clock signal shown in FIG. 4B is exemplified as the clock signal supplied to the processor 103. As the clock signal supplied to each of the peripheral circuit 104 and the memory 107, the clock signal having a frequency appropriate for each is supplied. However, the frequency is changed with the lapse of time as similar to FIG. 4B.

As shown in FIG. 1, the power source terminals PC1 and PC2 of the semiconductor device 101 and the electronic part 108 are coupled to the power source supply terminal PC3 of the power source circuit 109 through the power source line L1. When the burden of the semiconductor device 101 and/or the electronic part 108 is changed with the lapse of time, the current consumption flowing in the semiconductor device 101 and/or the electronic part 108 is increased or decreased. Further, the current consumption flowing in the semiconductor device 101 and/or the electronic part 108 is changed depending on changes in surrounding environments. In the case of the semiconductor device 101, when the ambient temperature is changed, the leak current is increased or decreased. Thus, the current consumption flowing in the semiconductor device 101 is increased or decreased (changed).

The value of the current consumption flowing in the power source supply terminal PC3 of the power source circuit 109 corresponds to the sum (the value of the total current consumption) of the current consumption of the semiconductor device 101 and the electronic part 108. Thus, if the current consumption of at least one of the semiconductor device 101 and the electronic part 108 is changed, the value is changed according to the change. The current consumption signal CIS has a voltage value in accordance with the value of the total current consumption Icc flowing in the power source supply terminal PC3 as described in FIG. 2. Therefore, the voltage value of the current consumption signal CIS is changed in accordance with the change in the current consumption (total current consumption) flowing in the power source supply terminal PC 3 with the lapse of time.

FIG. 4A shows the voltage change of the current consumption signal CIS with the lapse of time. The voltage change can be regarded as showing the change in the current value of the total current consumption. In such a case, the total current consumption is decreased once between time t0 and time t1, and then is increased in the example of FIG. 4A. The total current consumption is continuously increased up to near time t2, and then is decreased as shown by a dashed line unless the frequency of the clock signal is changed in the semiconductor device 101.

In the first embodiment, it is determined whether or not the value of the current consumption signal CIS has exceeded the predetermined threshold value (threshold value H) described in FIG. 3, and whether or not the value of the current consumption signal CIS has become lower than the predetermined threshold value (threshold value L) In the case where the value of the current consumption signal CIS has exceeded the predetermined threshold value (threshold value H), the A/D conversion circuit 106 supplies to the clock signal generation circuit 105 the clock selection signal FSD designating the clock signal having a frequency lower than the clock signal that is being output as described in FIG. 3. On the other hand, in the case where the value of the current consumption signal CIS has become lower than the predetermined threshold value (threshold value L), the A/D conversion circuit 106 outputs to the clock signal generation circuit 105 the clock selection signal FSD designating the clock signal having a frequency higher than the clock signal that is being output as described in FIG. 3.

In the case of the example of FIGS. 4A and 4B, the voltage value of the current consumption signal CIS that is changed in an analog manner with the lapse of time exceeds the threshold value (threshold value H) at the time t1. Accordingly, the A/D conversion circuit 106 outputs the clock selection signal FSD designating the clock signal having the frequency (f3) lower than the clock signal (frequency f1) that was output until the time t1. Accordingly, the frequency of the clock signal output from the clock signal generation circuit 105 is changed from the high frequency (f1) to the low frequency (f3). The frequency of the clock signal supplied to the processor 103 is lowered to the frequency (f3). Thus, the operation speed of the processor 103 becomes slow, and the current consumption in the processor 103 is reduced. In this case, the frequency of the clock signal supplied to each of the circuit blocks such as the peripheral circuit 103 and the memory 107 in the semiconductor device 101 is also lowered, and thus the operation speeds of the circuit blocks become slow. As a result, the current consumption of the semiconductor device 101 is reduced at the time t1, and the value of the total current consumption is reduced. Thus, the voltage value of the current consumption signal CIS is lowered.

The total current consumption is increased between the time t1 and the time t2. Thus, the voltage value of the current consumption signal CIS is raised again from the time t1, and exceeds the threshold value (threshold value H) again at the time t2. Accordingly, the A/D conversion circuit 106 outputs the clock selection signal FSD designating the clock signal (frequency f4) having a lower frequency at the time 2 instead of the clock signal having the frequency (f3) that has been designated until then. As a result, the frequency of the clock signal output from the clock signal generation circuit 105 is changed from the frequency (f3) to the lower frequency (f4). As similar to the time t1, the total current consumption is reduced at the time t2, and the voltage value of the current consumption signal CIS is decreased.

The value of the total current consumption reaches a peak around the time t2, and then is decreased. Along with this, the value of the current consumption signal CIS is raised once, and then is decreased. When the value of the current consumption signal CIS has become lower than the threshold value (threshold value L) at time t4, the A/D conversion circuit 106 outputs the clock selection signal FSD designating the clock signal (frequency f3) having a frequency higher than the frequency (f4) instead of the clock selection signal FSD that was output between the time t2 and the time t3, namely, the clock selection signal FSD designating the frequency (f4). Accordingly, the frequency of the clock signal output from the clock signal generation circuit 105 is changed to the frequency (f3) that is higher than the frequency (f4) that was output between the time t2 and the time t3. The frequency of the clock signal supplied to each of the circuit blocks (the processor 103, the peripheral circuit 104, the memory 107, and the like) in the semiconductor device 101 is increased, and the operation speeds become fast. The total current consumption is increased by increasing the operation speeds of the circuit blocks, and the voltage value of the current consumption signal CIS is increased once at the time t3.

In the example of FIGS. 4A and 4B, the total current consumption is gradually decreased after the time t3. Therefore, the voltage value of the current consumption signal CIS becomes lower than the threshold value (threshold value L) again at the time t4. As a result, as similar to the time t3, the frequency of the clock signal output from the clock signal generation circuit 105 is changed to the frequency (f1) higher than the frequency (f3) between the time t3 and the time t4. As a result, the circuit blocks are operated in accordance with the clock signal having the frequency (f1) after the time t4.

As described above, if the burden and/or the surrounding environments of the semiconductor device 101 and/or the electronic part 108 are changed and the total current consumption is increased, the frequency of the clock signal in the semiconductor device 101 is changed to a lower frequency in the first embodiment. Accordingly, it is possible to suppress the total current consumption from being increased. When the total current consumption is suppressed from being increased, the power source voltage supplied to each of the semiconductor device 101 and the electronic part 108 can be suppressed from being lowered, and the semiconductor device 101 and the electronic part 108 can be stably and continuously operated against the change in the burden and/or the change in the surrounding environments. In addition, the electronic device 100 can be stably operated.

Further, when the total current consumption is decreased, the frequency of the clock signal in the semiconductor device 101 is changed to a higher frequency again. Accordingly, when the total current consumption is decreased, the operation speed of the semiconductor device 101 can be made faster. As a result, the operation speed of the electronic device 100 can be improved.

In the first embodiment, the threshold value used for determination when the frequency of the clock signal is changed from a high frequency to a low frequency is different from that used for determination when the frequency of the clock signal is changed from a low frequency to a high frequency. Specifically, as the threshold values, the threshold value H and the threshold value L are used. In the first embodiment, shown is an example in which the control circuit 106-C in the A/D conversion circuit 106 compares the digital signal corresponding to the current consumption signal CIS with the threshold values (the threshold value H and the threshold value L). However, the present invention is not limited to this. For example, the clock signal generation circuit 105 may be provided with the function of the control circuit 106-C. Further, as the threshold values, the two threshold values (the threshold value H and the threshold value L) are exemplified. However, three or more threshold values may be used.

Further, no threshold values may be used. For example, the values of the digital signals output from the A/D conversion circuit 106 (the conversion circuit 106-A) may be associated with the frequency divider circuits 401 to 403 and the oscillation circuit 400 on a one-to-one basis. In this case, the frequency divider circuit (for example, 403) that forms the clock signal having a low frequency is allowed to be associated with the digital signal (high current consumption signal CIS) having a large value, and the frequency divider circuit (for example, 401) having a high frequency or the oscillation circuit 400 is allowed to be associated with the digital signal (low current consumption signal CIS) having a small value. Accordingly, when the total current consumption is large, the frequency of the clock signal output from the clock signal generation circuit is changed to be low. When the total current consumption is small, the frequency is changed to be high. In the case of such a configuration, the frequency of the clock signal is frequently changed. In order to avoid the situation, it is desirable to provide intervals at which the frequency is changed. For example, the selection circuit 404 may select a clock signal at regular intervals on the basis of the clock selection signal FSD from the A/D conversion circuit 106.

It should be noted that as the change of the frequency, FIGS. 4A and 4B show an example in which the frequency is changed from the frequency f1 to the frequency f3 as a frequency lower than the frequency f1. However, it is obvious that the frequency may be changed to the frequency f2 instead of the frequency f3.

Modified Example

Figure 5:
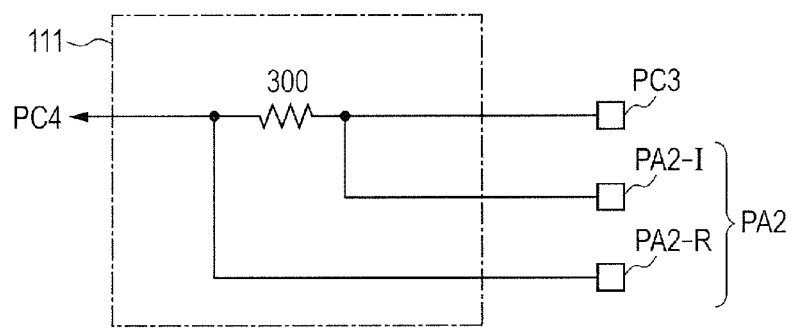
FIG. 5 is a circuit diagram for showing a configuration of a current consumption signal generation circuit according to a modified example of the first embodiment.

FIG. 5 is a circuit diagram for showing a configuration of a modified example of the current consumption signal generation circuit 111. In the modified example, instead of the ammeter 200 (FIG. 2), a resistive element 300 is used. Specifically, the current consumption signal generation circuit 111 has the resistive element 300. One terminal of the resistive element 300 is coupled to the power source terminal PC4 of the power source voltage supply circuit 110, and the other terminal is coupled to the power source supply terminal PC3 of the power source circuit 109. Further, one terminal of the resistive element 300 is coupled to a reference terminal PA2-R of the power source circuit 109, and the other terminal is coupled to a current signal terminal PA2-I of the power source circuit 109.

When the total current consumption flows in the resistive element 300, the voltage steps down between the terminals of the resistive element 300 in accordance with the level of the total current consumption at the time. The voltage difference between the terminals is extracted through the reference terminal PA2-R and the current signal terminal PA2-I. In this case, the current consumption signal CIS is represented as the voltage difference between the reference terminal PA2-R and the current signal terminal PA2-I, and the level of the voltage difference corresponds to the level of the voltage of the current consumption signal CIS. When FIG. 5 is associated with FIG. 1, the terminal PA2 of FIG. 1 can be regarded as being configured by the reference terminal PA2-R and the current signal terminal PA2-I.

In the modified example, the resistance value of the resistive element 300 is set in such a manner that the voltage of the power source voltage Vcc supplied to each of the semiconductor device 101 and the electronic part 108 becomes a desired voltage. Further, the resistance of the resistive element 300 is desirably low in order to reduce the voltage step-down in the resistive element 300.

Second Embodiment

Figure 6:
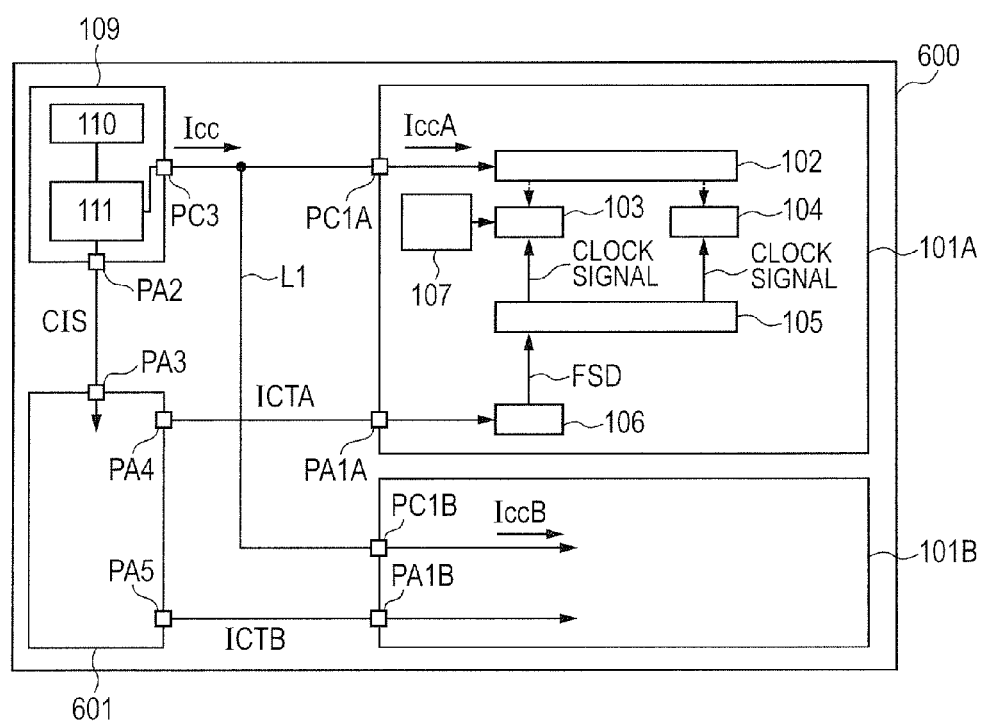
FIG. 6 is a block diagram for showing a configuration of an electronic device according to a second embodiment.

FIG. 6 is a block diagram for showing a configuration of an electronic device according to a second embodiment. In FIG. 6, the reference numeral 600 denotes an electronic device. The electronic device 600 includes a plurality of electronic parts to achieve the function of the electronic device 600. In the second embodiment, the electronic device includes at least two semiconductor devices 101A and 101B as the electronic parts. Further, the electronic device 600 includes a power source circuit 109 that supplies a power source voltage Vcc and a ground voltage Vss to the electronic device including the semiconductor devices 101A and 101B. Further, the electronic device 600 includes a current distribution control circuit 601 in the second embodiment.

The semiconductor devices 101A and 101B are not particularly limited, but have the same configuration. Thus, FIG. 6 shows a configuration of only the semiconductor device 101A. The configuration of the semiconductor device 101A is the same as that of the semiconductor device 101 shown in FIG. 1. Thus, the explanation thereof will be omitted unless the explanation is necessary. The semiconductor device 101B has the same configuration as that of the semiconductor device 101A. Thus, a detailed configuration is omitted in FIG. 6.

In FIG. 1, the power source terminal of the semiconductor device 101 is represented as PC1. In order to discriminate the power source terminal of the semiconductor device 101A from the power source terminal of the semiconductor device 101B, the power source terminal of the semiconductor device 101A is represented as PC1A, and the power source terminal of the semiconductor device 101B is represented as PC1B in FIG. 6. As similar to the above, the external terminal of the semiconductor device 101 is represented as PA1 in FIG. 1. However, in order to discriminate the external terminal of the semiconductor device 101A from the external terminal of the semiconductor device 101B, the external terminal of the semiconductor device 101A is represented as PA1A, and the external terminal of the semiconductor device 101B is represented as PA1B in FIG. 6.

It should be noted that the configurations of the semiconductor devices 101A and 101B are the same. However, programs stored in memories 107 are different from each other. Because the programs differ from each other, the semiconductor device 101A and the semiconductor device 101B provide functions that are different from each other.

The configuration of the power source circuit 109 is the same as that of the power source circuit 109 shown in FIG. 1, and thus the explanation thereof will be omitted. A power source supply terminal PC3 of the power source circuit 109 is coupled to the power source terminal PC1A of the semiconductor device 101A and the power source terminal PC1B of the semiconductor device 101B through a power source line L1. When the semiconductor device 101A is operated in accordance with the program, current consumption IccA flows in the power source terminal PC1A. When the semiconductor device 101B is operated in accordance with the program, current consumption IccB flows in the power source terminal PC1B. When the electronic device 600 is operated, total current consumption Icc corresponding to the sum of the current consumption IccA and the current consumption IccB flows in the power source supply terminal PC3 of the power source circuit. It should be noted that a ground terminal related to the ground voltage Vss, a ground supply terminal, and a power source line are omitted in FIG. 6.

In the first embodiment, the current consumption signal CIS output from the power source circuit 109 is supplied to the external terminal PA1 of the semiconductor device 101. On the contrary, in the second embodiment, the current consumption signal CIS is supplied to the current distribution control circuit 600. Further, a current consumption control signal ICTA from the current distribution control circuit 601 is supplied to the external terminal PA1A of the semiconductor device 101A corresponding to the external terminal PA1 of the semiconductor device 101. As similar to the above, a current consumption control signal ICTB from the current distribution control circuit 601 is supplied to the external terminal PA1B of the semiconductor device 101B corresponding to the external terminal PA1 of the semiconductor device 101.

The current distribution control circuit 601 includes a terminal PA3 that receives a current consumption signal CIS, a terminal PA4 that outputs the current consumption control signal ICTA, and a terminal PA5 that outputs the current consumption control signal ICTB. Using the current consumption control signals ICTA and ICTB, the current distribution control circuit 601 separately controls the frequency of the clock signal output from the clock signal generation circuit 105 in the semiconductor device 101A and the frequency of the clock signal output from the clock signal generation circuit 105 in the semiconductor device 101B. In the control, the current distribution control circuit 601 grasps the total current consumption Icc using the current consumption signal CIS, and forms the current consumption control signals ICTA and ICTB to prevent the total current consumption Icc from exceeding a predetermined value (for example, a maximum allowable current).

<Configuration of Current Distribution Control Circuit>

FIG. 7 is a block diagram for showing a configuration of the current distribution control circuit. In FIG. 7, the reference numeral 700 denotes an A/D conversion circuit; 701, a processor; and 702 and 703, digital/analog conversion circuits (hereinafter, referred to as D/A conversion circuits). The A/D conversion circuit 700 converts the current consumption signal CIS that is an analog signal into a current consumption signal CIS-D that is a digital signal. In response to the digital signal CIS-D output from the A/D conversion circuit 701, the processor 701 forms a current consumption control signal ICTA-D to control the semiconductor device 101A and forms a current consumption control signal ICTB-D to control the semiconductor device 101B. In response to the current consumption control signal ICTA-D that is a digital signal, the D/A conversion circuit 702 forms the current consumption control signal ICTA that is an analog signal. As similar to the above, in response to the current consumption control signal ICTB-D that is a digital signal, the D/A conversion circuit 703 forms the current consumption control signal ICTB that is an analog signal.

The processor 701 is operated in accordance with a program stored in a memory (not shown). In accordance with the program, the processor 701 separately changes the values of the current consumption control signal ICTA-D and the current consumption control signal ICTB-D with the lapse of time. For example, the processor 701 outputs the digital current consumption control signal ICTA-D so as to lower the voltage of the current consumption control signal ICTA when the power is turned on. On the other hand, at the same time, the processor 701 outputs the digital current consumption control signal ICTB-D so as to increase the voltage of the current consumption control signal ICTB. Further, when a certain period of time elapses after the power is turned on, the processor 701 outputs the digital current consumption control signal ICTA-D so as to increase the voltage of the current consumption control signal ICTA. On the other hand, at the same time, the processor 701 outputs the digital current consumption control signal ICTB-D so as to lower the voltage of the current consumption control signal ICTB.

Accordingly, the current consumption control signal ICTA having a low voltage is supplied to the external terminal PA1A of the semiconductor device 101A when the power is turned on, and thus the frequency of the clock signal output from the clock signal generation circuit 105 in the semiconductor device 101A is increased. On the contrary, the current consumption control signal ICTB having a high voltage is supplied to the external terminal PA1B of the semiconductor device 101B, and thus the frequency of the clock signal output from the clock signal generation circuit 105 in the semiconductor device 101B is lowered. As a result, the operation speed of the semiconductor device 101A is increased when the power is turned on, and the operation speed of the semiconductor device 101B is decreased. When the operation speed of the semiconductor device 101A is increased, the current consumption IccA of the semiconductor device 101A becomes large. However, the operation speed of the semiconductor device 101B is decreased, and thus the current consumption IccB of the semiconductor device 101B becomes small. Accordingly, it is possible to improve the operation speed of the semiconductor device 101A while suppressing the total current consumption Icc from becoming large.

As similar to the above, the current consumption control signal ICTA having a high voltage is supplied to the external terminal PA1A of the semiconductor device 101A when a certain period of time elapses after the power is turned on, and thus the frequency of the clock signal output from the clock signal generation circuit 105 in the semiconductor device 101A is lowered. On the contrary, the current consumption control signal ICTB having a low voltage is supplied to the external terminal PA1B of the semiconductor device 101B, and thus the frequency of the clock signal output from the clock signal generation circuit 105 in the semiconductor device 101B is increased. As a result, the operation speed of the semiconductor device 101A is decreased when a certain period of time elapses after the power is turned on, and the operation speed of the semiconductor device 101B is increased. When the operation speed of the semiconductor device 101B is increased, the current consumption IccB of the semiconductor device 101S becomes large. However, the operation speed of the semiconductor device 101A is decreased, and thus the current consumption IccA of the semiconductor device 101A becomes small. Accordingly, it is possible to improve the operation speed of the semiconductor device 101B while suppressing the total current consumption Icc from becoming large.

Further, the processor 701 changes the values of the current consumption control signals ICTA-D and ICTB-D while monitoring the value of the current consumption signal CIS-D. Specifically, the processor 701 sets the value of the current consumption signal CIS-D when the total current consumption Icc reaches the maximum current consumption as a predetermined threshold value, and changes the values of the current consumption control signals ICTA-D and ICTB-D so that the current consumption signal CIS-D does not reach the predetermined threshold value.

Accordingly, the operation speed of the semiconductor device can be selectively improved while preventing the total current consumption Icc from reaching the maximum allowable current.

<Operation of Electronic Device>

Next, an operation of the electronic device 600 according to the second embodiment will be described. FIGS. 8A-8E are waveform diagrams each showing the waveform of the electronic device 600. In each of FIGS. 8A-8E, the horizontal axis represents time. FIG. 8A shows the waveform of the total current consumption Icc with the lapse of time, FIG. 8B shows the waveform of the current consumption IccA of the semiconductor device 101A, and FIG. 8D shows the waveform of the current consumption IccB of the semiconductor device 101B. In each of FIG. 8A, FIG. 8B, and FIG. 8D, the vertical axis represents a current, and the alternate long and short dash line represents the maximum allowable current. The value of the maximum allowable current is set on the basis of the current supply capability of the power source circuit 109, the allowable current capability of the power source line, and the like. For example, when exceeding the maximum allowable current, the voltage value of the power source voltage Vcc output from the power source circuit 109 is lowered, leading to the operation instability or malfunction of the electronic device and the semiconductor device. Further, there is a concern that the power source line ignites.

FIG. 8C shows the waveform of the current consumption control signal ICTA, and FIG. 8E shows the waveform of the current consumption control signal ICTB. The vertical axis in each of FIG. 8C and FIG. 8E represents a voltage. Each of FIG. 8C and FIG. 8E shows a case in which the current consumption control signals ICTA and ICTB are based on the power source voltage Vcc. Specifically, the high or low voltages of the current consumption control signals ICTA and ICTB are based on the power source voltage Vcc.

In the following description, shown is an example in which the electronic device 600 is an electronic device that controls a motor incorporated in a camera. In this case, the semiconductor device 101A controls the power source of the camera, and executes a self-check for the electronic device provided in the camera. The self-check is executed, for example, when the power of the camera is turned on. Therefore, when the power is turned on, the burden of the semiconductor device 101A is increased. On the other hand, the semiconductor device 101B controls a normal operation of the camera, for example, a photographing operation. Therefore, the burden of the semiconductor device 101B is increased after the power is turned on. In the second embodiment, the processing capability of the semiconductor device 101A is given priority when the power of the camera is turned on, and the processing capability of the semiconductor device 101B is given priority at the time of the normal operation.

In FIGS. 8A-8E, it is assumed that the power of the camera is turned on at time t1. The processor 701 changes the digital current consumption control signal ICTA-D so as to gradually lower the voltage of the current consumption control signal ICTA in accordance with a program (In FIG. 8C, the voltage is changed toward the ground voltage Vss). In this case, the processor 701 forms the digital current consumption control signal ICTB-D so as to keep the voltage of the current consumption control signal ICTB high (FIG. 8E).

When the voltage of the current consumption control signal ICTA is gradually lowered, the frequency of the clock signal output from the clock signal generation circuit 105 in the semiconductor device 101A is gradually changed from a low frequency to a high frequency between the time t1 and time t3. Accordingly, the operation speed of the processing circuit in the semiconductor device 101A is increased, and the power control and the self-check by the semiconductor device 101A can be swiftly performed (increase in processing capability). As the frequency of the clock signal is increased, the current consumption IccA of the semiconductor device 101A is increased from the time t1 as shown in FIG. 8B. On the other hand, the current consumption control signal ICTB is kept high between the time t1 and the time t3 as shown in FIG. 8E, and thus the frequency of the clock signal output from the clock signal generation circuit 105 in the semiconductor device 101B is lowered. Therefore, the current consumption IccB of the semiconductor device 101B is kept at a small value.

When the power is turned on, the semiconductor device 101A has priority to process. Therefore, the total current consumption Icc starts to be increased from the time t1 mainly in accordance with an increase in the current consumption IccA of the semiconductor device 101A. When the total current consumption Icc is increased, the value of the current consumption signal CIS becomes large. When the value of the current consumption signal CIS becomes close to a predetermined value, the processor 701 changes the digital current consumption control signal ICTA-D so as to increase the voltage of the current consumption control signal ICTA as shown near time t2 (the voltage is changed toward the power source voltage Vcc). Accordingly, the total current consumption Icc is decreased before the total current consumption Icc reaches the maximum allowable current.

When the power of the camera is turned on and, for example, the self-check by the semiconductor device 101A is completed, the processor 701 changes the digital current consumption control signal ICTA-D so as to increase the voltage of the current consumption control signal ICTA.

In FIGS. 8A-8E, the camera starts to photograph at the time t3. When the camera starts to photograph, the processor 701 changes the digital current control signal ICTB-D so as to gradually lower the voltage of the current control signal ICTB in accordance with a program (FIG. 8E). In this case, the processor 701 changes the digital current control signal ICTA-D so as to increase the voltage of the current control signal ICTA (FIG. 8C).

When the voltage of the current control signal ICTB is gradually lowered, the frequency of the clock signal output from the clock signal generation circuit 105 in the semiconductor device 101B is gradually changed from a low frequency to a high frequency between the time t3 and time t5. Accordingly, the operation speed of the processing circuit in the semiconductor device 101B is increased, and the photographing operation by the semiconductor device 101B can be swiftly controlled (increase in processing capability). As the frequency of the clock signal is increased, the current consumption IccB of the semiconductor device 101B is increased from the time t3 as shown in FIG. 8D. On the other hand, the current consumption control signal ICTA is gradually changed to a higher voltage as shown in FIG. 8C. Therefore, the frequency of the clock signal output from the clock signal generation circuit 105 in the semiconductor device 101A is gradually lowered. As a result, the total current consumption Icc can be suppressed from being increased.

As described above, when the semiconductor devices 101A and 101B are sequentially controlled, the specific processing capability of each semiconductor device can be increased while suppressing the total current consumption from being increased.

In FIG. 7, an example of forming the current consumption control signals ICTA-D and ICTB-D using the processor 701 has been described. However, the present invention is not limited to this. For example, a timer circuit that generates a timing signal may be used instead of the processor 701. In this case, the timer circuit sequentially controls the timing when the processing capability of the semiconductor device 101A is increased and the timing when the processing capability of the semiconductor device 101B is increased. At this time, the current consumption signal CIS-D output from the A/D conversion circuit 700 is supplied as a digital current consumption control signal corresponding to the current consumption control signal supplied to the semiconductor device for which the processing capability is increased. Accordingly, the processing capabilities of the semiconductor devices 101A and 101B can be sequentially increased, and the current consumption of the semiconductor device for which the processing capability is increased can be changed in accordance with the value of the total current consumption Icc.

Further, the second embodiment has been described using an example of two semiconductor devices 101A and 101B. However, it is obvious that the present invention can be applied to three or more semiconductor devices. In this case, too, the increase in the processing capabilities of three or more semiconductor devices can be sequentially controlled while suppressing the total current consumption from being increased.

Modified Example

In FIG. 7, the processor 701 forms the current consumption control signals ICTA-D and ICTB-D in accordance with the current consumption signal CIS-D. In this case, the processor 701 changes the current consumption control signal ICTA-D and/or the current consumption control signal ICTB-D so that the total current consumption Icc does not exceed the maximum allowable current. Specifically, the processor 701 monitors the current consumption signal CIS-D, and forms the digital current consumption control signals ICTA-D and ICTB-D so as to increase both or one of the voltages of the current consumption control signals ICTA and ICTB before the current consumption signal CIS-D reaches the value corresponding to the maximum allowable current. Accordingly, in both or one of the semiconductor devices 101A and 101B, the frequency of the clock signal is changed to a lower frequency. As a result, the total current consumption Icc is decreased, and can be prevented from exceeding the maximum allowable current.

Further, when the value of the current consumption signal CIS-D is decreased to a predetermined value in monitoring of the current consumption signal CIS-D, the processor 701 forms the digital current consumption control signals ICTA-D and ICTB-D so as to lower both or one of the voltages of the current consumption control signals ICTA and ICTB. Accordingly, the processing capabilities of the semiconductor devices 101A and 101B can be improved. The processor 701 repeatedly executes the above-described operation.

In the above-described operation, when one of the voltages of the current consumption control signals ICTA and ICTB is increased (decreased), which current consumption control signal is increased (decreased) may be preliminarily set by a program executed by the processor 701.

Third Embodiment

Figure 9:
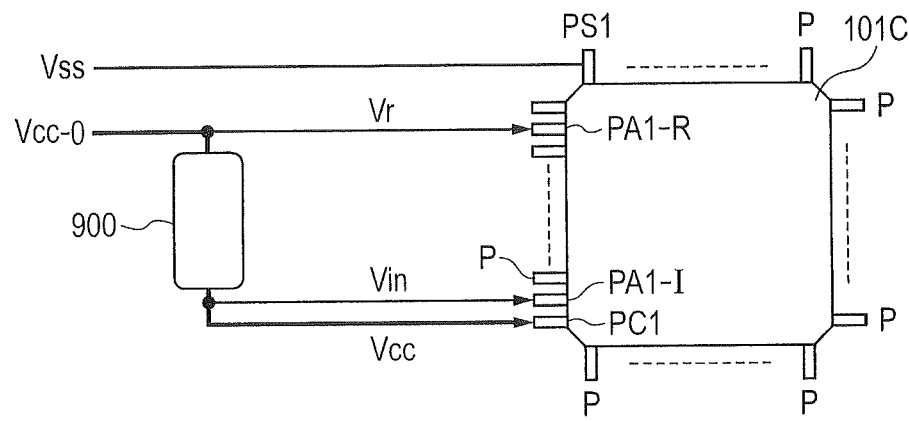
FIG. 9 is a block diagram for showing a configuration of a semiconductor device according to a third embodiment.

FIG. 9 is a block diagram for showing a configuration of a semiconductor device according to a third embodiment. In FIG. 9, only a semiconductor device 101C and a resistive element 900 used as electronic parts are shown among a power source circuit and a plurality of electronic parts included in an electronic device.

As described in the first embodiment, the semiconductor device includes the semiconductor chip and the package sealing the semiconductor chip, and the package is provided with the external terminals. In FIG. 9, the semiconductor device sealed in the package is shown.

The configuration of the circuit blocks formed in the semiconductor chip is similar to that shown in FIG. 1, and thus is omitted in FIG. 9. Where the configuration of the circuit blocks formed in the semiconductor chip differs from that in the semiconductor device 101 shown in FIG. 1, an A/D conversion circuit 106 included in the semiconductor device 101C changes the analog voltage value of a control voltage Vin relative to a reference voltage Vr to the digital value. The converted digital signal is supplied to a clock signal generation circuit 105 as similar to the first embodiment.

In FIG. 9, PS1 denotes a ground terminal of the semiconductor device 101C, and PC1 denotes a power source terminal of the semiconductor device 101C. Further, PA1-R denotes an external terminal of the semiconductor device 101C to which the reference voltage Vr is supplied, and PA1-I denotes an external terminal of the semiconductor device 101C to which the control voltage Vin is supplied. In FIG. 9, each p denotes an external terminal of the semiconductor device 101C other than the above-described external terminals.

Although not shown in FIG. 9, the power source voltage supply circuit 110 shown in FIG. 1 is used as the power source circuit included in the electronic device. The power source voltage output from the power source circuit (power source voltage supply circuit 110) is supplied to the power source terminal PC1 of the semiconductor device 101C through the resistive element 900. The resistance value of the resistive element 900 is set small. However, when the current consumption Icc of the semiconductor device 101C flows in the resistive element 900, the voltage is stepped down. In FIG. 9, the power source voltage supplied to the power source terminal PC1 of the semiconductor device 101C is represented as Vcc, and the power source voltage output from the power source circuit is represented as Vcc-0. One terminal of the resistive element 900 is coupled to the external terminal PA1-R of the semiconductor device 101C, and the other terminal is coupled to the external terminal PA1-I of the semiconductor device 101C. Further, a ground voltage Vss output from the power source circuit is supplied to the ground terminal PS1 of the semiconductor device 1010.

As described in the first embodiment, the semiconductor device 101C is operated in accordance with the clock signal output from the clock signal generation circuit 105. When the semiconductor device 101C is operated, the current consumption Icc flows in the power source terminal PC1 of the semiconductor device 101C. When the current consumption Icc flows, the voltage is stepped down in the resistive element 900. In the third embodiment, the voltage generated at one terminal of the resistive element 900 is supplied to the external terminal PA1-R of the semiconductor device 101C as the reference voltage Vr. Further, the voltage generated at the other terminal of the resistive element 900 is supplied to the external terminal PA1-I of the semiconductor device 101C as the control voltage Vin. Accordingly, the voltage value of the control voltage Vin is changed in accordance with the value of the current consumption of the semiconductor device 101C on the basis of the reference voltage Vr. In other words, a voltage difference between the reference voltage Vr and the control voltage Vin is changed in accordance with the value of the current consumption of the semiconductor device 101C.

The A/D conversion circuit 106 (see FIG. 1) in the semiconductor device 101C converts the voltage difference of the control voltage Vin relative to the reference voltage Vr into a digital signal. When the voltage difference of the control voltage Vin relative to the reference voltage Vr becomes large, the frequency of the clock signal output from the clock signal generation circuit 105 (see FIG. 1 and FIG. 3) is lowered as similar to the first embodiment. On the contrary, when the voltage difference of the control voltage Vin relative to the reference voltage Vr becomes small, the frequency of the clock signal output from the clock signal generation circuit 105 is increased.

Figure 10A:
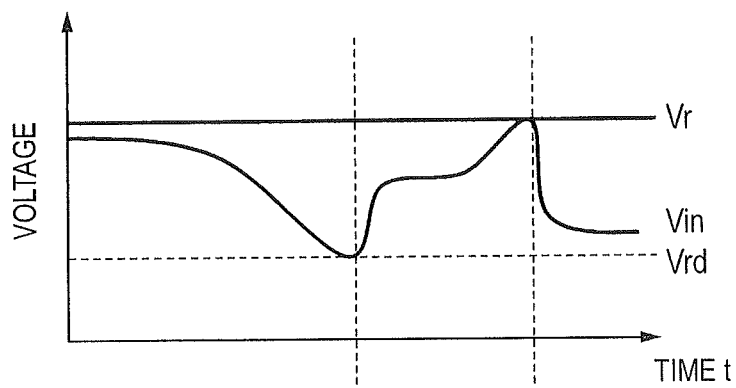
FIGS. 10A and 10B are waveform diagrams each showing an operation of the semiconductor device according to the third embodiment.
Figure 10B:
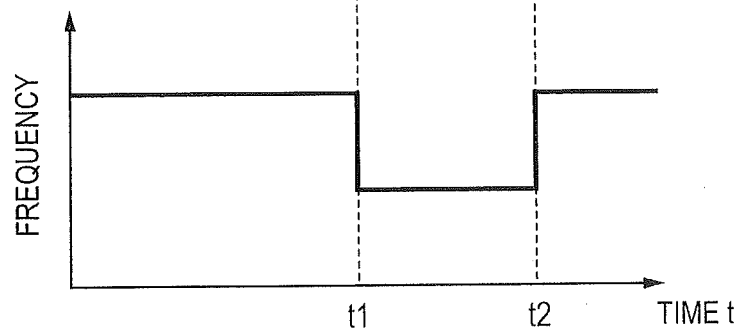

FIGS. 10A and 10B are waveform diagrams each showing an operation of the semiconductor device 101C. In FIGS. 10A and 10B, each horizontal axis represents time. The vertical axis of FIG. 10A represents a voltage, and shows a voltage change in the control voltage Vin with the lapse of time. Further, the vertical axis of FIG. 10B represents a frequency, and shows a frequency change in the clock signal with the lapse of time. In this case, the clock signal shown in FIG. 10B is not particularly limited, but shows the clock signal supplied to the processor 103 (see FIG. 1) in the semiconductor device 101C, namely, the operation frequency of the processor 103.

Next, with reference to FIG. 1 and FIGS. 10A and 10B, an operation of the semiconductor device 101C shown in FIG. 9 will be described. When the processing circuit such as the processor 103 starts to be operated in accordance with the clock signal output from the clock signal generation circuit 105, the current consumption Icc flowing in the power source terminal PC1 of the semiconductor device 101C is gradually increased. Accordingly, the step-down voltage generated in the resistive element 300 is gradually increased. As a result, the voltage difference of the control voltage Vin relative to the reference voltage Vr is gradually increased (the control voltage Vin is directed downward relative to the reference voltage Vr in FIG. 10A).

When the control voltage Vin reaches a predetermined threshold voltage Vrd at time t1, a control circuit 106-C in the A/D conversion circuit 106 outputs a clock selection signal FSD designating the clock signal having a low frequency to a selection circuit 404. Accordingly, the frequency of the clock signal supplied to the processing circuit in the semiconductor device 101C is changed to a low frequency. As a result, the current consumption of the semiconductor device 101C is decreased, and the voltage difference of the control voltage Vin relative to the reference voltage Vr is gradually decreased (the control voltage Vin is directed toward the reference voltage Vr in FIG. 10A).

When the control voltage Vin reaches a predetermined threshold voltage Vr at time t2, the control circuit 106-C in the A/D conversion circuit 106 outputs the clock selection signal FSD designating the clock signal having a high frequency to the selection circuit 404. Accordingly, the frequency of the clock signal supplied to the processing circuit in the semiconductor device 101C is changed to a high frequency. As a result, the current consumption of the semiconductor device 101C is increased again, and the voltage value of the control voltage Vin is gradually decreased.

By repeating the above-described operation, the frequency is automatically changed so that the current consumption of the semiconductor device 101C does not exceed a predetermined value. Further, the current consumption can be adjusted so as not to exceed a predetermined value using a small number of elements.

The reference voltage Vr is used as the predetermined threshold voltage as described above. However, the present invention is not limited to this, but a voltage between the reference voltage Vr and the power source voltage Vcc may be used.

As hysteresis when the frequency of the clock signal is changed, an example of using two threshold voltages has been described. However, the present invention is not limited to this, but no clock signal may be changed in a predetermined period of time as similar to the first embodiment.

Fourth Embodiment

In the development of an electronic device using a semiconductor device as an electronic part, the processing capability and current consumption of the semiconductor device are grasped. In a fourth embodiment, provided is a semiconductor device that is useful in grasping the processing capability and current consumption of the semiconductor device.

FIG. 11 is a block diagram for showing a configuration of grasping the processing capability of a semiconductor device according to the fourth embodiment. In FIG. 11, 101D denotes a semiconductor device incorporated in an electronic device as an electronic part. The semiconductor device 101D has the same configuration as the third embodiment. Therefore, the explanation of the configuration of the semiconductor device 101D will be omitted unless the explanation is necessary.

In the fourth embodiment, a power source voltage Vcc is supplied to a power source terminal PC1 of the semiconductor device 101D, a ground voltage Vss is supplied to a ground terminal PS1, and a reference voltage Vr is supplied to an external terminal PA1-R of the semiconductor device 101D. A control voltage Vin is supplied to an external terminal PA1-I of the semiconductor device 101D.

Unlike the third embodiment, the control voltage Vin is formed by a resistance voltage-dividing circuit. Specifically, the resistance voltage-dividing circuit is configured using resistive elements R110 and R111 that are coupled in series between the power source voltage Vcc and the ground voltage Vss, and the control voltage Vin is output from a coupling point between the resistive elements R110 and R111. Further, the resistive element R110 is configured using a variable resistive element (hereinafter, the variable resistive element is represent as R110). When the processing capability and current consumption of the semiconductor device 101D are grasped, the resistance value of the variable resistive element R110 is changed.

When the resistance value of the variable resistive element R110 is changed, the voltage value of the control voltage Vin is changed. An A/D conversion circuit 106 in the semiconductor device 101D converts the voltage value of the control voltage Vin relative to the reference voltage Vr into a digital signal to be supplied to a clock signal generation circuit 105 as similar to the third embodiment. Accordingly, when the resistance value of the variable resistive element R110 is changed in the development, the frequency of a clock signal in the semiconductor device 101D can be changed.

FIGS. 12A and 12B are waveform diagrams each showing an operation of the semiconductor device 101C shown in FIG. 11. In FIGS. 12A and 12B, each horizontal axis represents time. Further, the vertical axis of FIG. 12A represents a voltage, and FIG. 12A shows the waveform of the control voltage Vin when the resistance value of the variable resistive element R110 is changed with the lapse of time. The vertical axis of FIG. 12B represents a frequency, and FIG. 12B shows a change in the frequency of the clock signal in the semiconductor device 101D relative to the control voltage Vin.

When the resistance value of the variable resistive element R110 is changed, the voltage of the control voltage Vin is changed. The semiconductor device 101D allows the clock signal generation circuit 105 to supply to the processing circuit the clock signal having a frequency in accordance with the supplied control voltage Vin. Accordingly, the processing circuit is operated in accordance with the clock signal having the supplied frequency. At this time, the processing capability in the semiconductor device 101D is grasped. Further, the current consumption flowing in the power source terminal PC1 of the semiconductor device 101D is measured.

When the resistance value of the variable resistive element R110 is changed, the control voltage Vin is changed as shown in FIG. 12A. When the value of the control voltage Vin is changed, the frequency of the clock signal in the semiconductor device 101D is changed at each of time t1 to time t7. When the frequency of the clock signal is changed, the processing capability and current consumption of the semiconductor device 101D are grasped. Accordingly, the processing capability and current consumption of the semiconductor device 101D can be grasped while changing the frequency of the clock signal under the control outside the semiconductor device 101D.

The processing capability and current consumption of each of a processor 102 and a peripheral circuit 103 can be changed by a program. Therefore, although the processing capability and current consumption of the semiconductor device 101D can be changed by changing the program, the burden to change the program is generated.

According to the fourth embodiment, for example, a program that can realize the highest processing capability is produced, and is stored in the semiconductor device 101D. Thereafter, the processing capability and current consumption relative to each control voltage Vin are grasped while changing the control voltage Vin. The control voltage Vin corresponding to the desired processing capability and current consumption is selected on the basis of the grasped processing capability and current consumption, and is supplied to the semiconductor device 101D. Accordingly, the semiconductor device having the desired processing capability and current consumption can be provided without changing the program.

FIG. 11 shows an example of configuring the control voltage Vin using the resistance voltage-dividing circuit. However, the present invention is not limited to this, but any circuit that can form a variable voltage as the control voltage Vin may be used.

In any one of the first to fourth embodiments, the frequency of the clock signal by which the semiconductor device is operated can be controlled from the outside of the semiconductor device, and the current consumption of the semiconductor device can be controlled from the outside of the semiconductor device. Further, in the case where a process executed by the semiconductor device is changed by changing a program executed by the processor in the semiconductor device, the current consumption of the semiconductor device is changed. However, in this case, the current consumption can be suppressed from being increased.

Further, even when the operating voltage and/or the surrounding environments are changed, the current consumption can be limited so as not to exceed the maximum allowable current. Further, even in the case where the current consumption varies due to variation in manufacturing of the semiconductor device and/or the electronic parts, the current consumption can be limited so as not to exceed the maximum allowable current of the semiconductor device and/or the electronic device.

From the viewpoint of the electronic device, when the current consumption is increased due to a failure of any one of the electronic parts, the semiconductor device according to each embodiment is operated so as to decrease the current consumption thereof. Thus, the safety can be improved.

In the second embodiment, the current consumption is controlled by the semiconductor devices. Thus, the current consumption can be more finely controlled, and the electronic device can be operated around the maximum allowable current.

Further, the frequency of the clock signal of the semiconductor device is changed while always monitoring the operation state and the surrounding environments. Thus, the current consumption can be suppressed from being increased against changes in the operation state and the surrounding environments. Therefore, even if the current consumption of the electronic device is not estimated in advance in consideration of the changes in the operation state and the surrounding environments, the current consumption can be controlled so as not to exceed the maximum allowable current. In the case where the semiconductor device has a processor, for example, the timing of operating the peripheral circuit and the frequency of the clock signal can be set by a program executed by the processor. Therefore, the timing of increasing or decreasing the current consumption can be set by adjusting the timing of operating the peripheral circuit or the timing of changing the clock signal with the program. Accordingly, the current consumption can be dispersed by a program so as not to exceed the maximum allowable current in the development of the electronic device. However, the current consumption is changed due to a change in the surrounding environments, and thus it takes much time to preliminarily produce a program that exhibits the maximum processing capability while preventing the current consumption from exceeding the maximum allowable current. According to each embodiment, the current consumption can be controlled in accordance with the operation state and the surrounding environments, and thus a program can be easily produced.

In the description of each embodiment, when the value of the current consumption signal CIS becomes large, the frequency of the clock signal is lowered. Further, when the value of the current consumption signal CIS becomes small, the frequency of the clock signal is increased. However, it is obvious that the present invention is not limited to this, but may be configured in an opposite manner.

The invention achieved by the inventors has been concretely described above on the basis of the embodiments. However, it is obvious that the present invention is not limited to the embodiments, but can be variously changed without departing from the scope of the invention.

What is claimed is:

1. A semiconductor device comprising:
   a clock signal generation circuit that generates a clock signal;
   a processing circuit that is operated in accordance with the clock signal generated by the clock signal generation circuit;
   an external terminal; and
   a power source terminal that is coupled to the processing circuit,
   wherein the clock signal generation circuit changes the frequency of the clock signal to be generated in accordance with the value of an analog signal supplied to the external terminal,
   wherein the value of the analog signal used when increasing the frequency of the clock signal is different from that used when lowering the frequency of the clock signal in accordance with current consumption, and
   wherein the analog signal is supplied to the external terminal externally from the semiconductor device.

2. The semiconductor device according to claim 1,
   wherein the semiconductor device includes an analog/digital conversion circuit coupled to the external terminal, and
   wherein the clock signal generation circuit includes a selection circuit to which a plurality of clock signals having frequencies that are different from each other is supplied, which selects one of the clock signals corresponding to a digital signal in accordance with the digital signal from the analog/digital conversion circuit, and which supplies the selected clock signal to the processing circuit.

3. The semiconductor device according to claim 2,
   wherein the clock signal generation circuit includes:
   an oscillation circuit that forms the clock signal; and a plurality of frequency divider circuits having frequency-division ratios that are different from each other, and wherein each of the frequency divider circuits divides the frequency of the clock signal formed by the oscillation circuit to form the clock signals supplied to the selection circuit.

4. The semiconductor device according to claim 1, wherein the power source circuit includes a current consumption signal generation circuit that outputs the analog signal in accordance with a current flowing in the power source terminal.

5. The semiconductor device according to claim 1, further comprising a plurality of electronic parts,
wherein the analog signal is varied in accordance with a current flowing in the electronic parts.

6. The semiconductor device according to claim 1,
wherein a current consumption of the semiconductor device is controlled from outside of the semiconductor device through the analog signal supplied to the external terminal.

7. The semiconductor device according to claim 1,
wherein the value of the analog signal supplied to the external terminal is in accordance with a measured current consumption.

8. The semiconductor device according to claim 1, further comprising a plurality of conductive parts,
wherein the analog signal is varied in accordance with a current flowing in the conductive parts.

9. The semiconductor device according to claim 1, wherein the analog signal supplied to the external terminal is varied in accordance with a current of the semiconductor device that is determined, and
wherein the voltage value of the analog signal is changed with a lapse of time and the current.

10. A semiconductor device comprising:
a clock signal generation circuit that generates a clock signal;
a processing circuit that is operated in accordance with the clock signal generated by the clock signal generation circuit;
an external terminal; and
a power source terminal that is coupled to the processing circuit,
wherein the clock signal generation circuit changes the frequency of the clock signal to be generated in accordance with the value of an analog signal supplied to the external terminal,
wherein an analog signal that is changed in accordance with a current flowing in the power source terminal is supplied to the external terminal.

11. An electronic device as the semiconductor device according to claim 10, comprising a plurality of electronic parts each having a power source terminal and a power source circuit coupled to the power source terminal of each of the electronic parts through a power source line,
wherein each of a first electronic part and a second electronic part of the electronic parts includes:
an external terminal to which a current control signal is supplied;
a clock signal generation circuit that generates a clock signal; and
a processing circuit that is operated in accordance with the clock signal,
wherein the frequency of the clock signal generated by the clock signal generation circuit is changed by the current control signal, and wherein the power source circuit includes a current distribution control circuit that forms a first current control signal supplied to an external terminal of a first semiconductor device that is the first electronic part and a second current control signal supplied to an external terminal of a second semiconductor device that is the second electronic part, and the current distribution control circuit controls to increase the frequency of the clock signal in the first semiconductor device or the second semiconductor device using the first current control signal and the second current control signal.

12. The electronic device according to claim 11,
wherein the power source circuit includes a current consumption signal generation circuit that generates a current consumption signal in accordance with a current flowing in the electronic parts, and
wherein the current distribution control circuit forms the first current control signal and the second current control signal in response to the current consumption signal.

13. The electronic device according to claim 12,
wherein each of the first current control signal and the second current control signal is an analog signal,
wherein each of the first semiconductor device and the second semiconductor device includes an analog/digital conversion circuit coupled to the external terminal, and
wherein the clock signal generation circuit includes a selection circuit which selects one of the clock signals having frequencies that are different from each other in accordance with a digital signal from the analog/digital conversion circuit, and which supplies the selected clock signal to the processing circuit.

14. The semiconductor device according to claim 10,
wherein the frequency of the clock signal generated is changed in accordance with the value of the analog signal that changes in accordance with a measurement in the power source terminal.

15. The semiconductor device according to claim 10,
wherein the semiconductor device includes an analog/digital conversion circuit coupled to the external terminal, and
wherein the clock signal generation circuit includes a selection circuit to which a plurality of clock signals having frequencies that are different from each other is supplied.

16. The semiconductor device according to claim 10,
wherein the frequency of the clock signal that operates the processing circuit is controlled by the analog signal supplied to the external terminal, and thus the current consumption of the semiconductor device can be controlled from the outside of the semiconductor device.

17. The semiconductor device according to claim 10,
wherein the clock signal generation circuit includes:
an oscillation circuit that forms the clock signal; and
a plurality of frequency divider circuits having frequency-division ratios that are different from each other, and
wherein each of the frequency divider circuits divides the frequency of the clock signal formed by the oscillation circuit to form the clock signals supplied to a selection circuit.

18. The semiconductor device according to claim 10, wherein the analog signal supplied to the external terminal is varied in accordance with a total current consumption of the semiconductor device to change the frequency of the clock signal, and wherein the clock signal generation circuit changes the frequency of the clock signal to be generated in accordance with the value of the analog signal that is variable.

19. An electronic device as a semiconductor device comprising a plurality of electronic parts each having a power source terminal and a power source circuit coupled to the power source terminal of each of the electronic parts through a power source line,
- wherein the power source circuit includes a current consumption signal generation circuit that outputs an analog signal in accordance with a current flowing in the electronic parts,
- wherein one of the electronic parts includes:
- an external terminal to which the analog signal is supplied;
- a clock signal generation circuit that generates a clock signal; and
- a processing circuit that is operated in accordance with the clock signal, and
- wherein the frequency of the clock signal generated by the clock signal generation circuit is changed in accordance with the value of the analog signal.

20. The electronic device according to claim 19,
wherein the power source circuit includes:
- a power source supply terminal coupled to the power source terminals of the electronic parts through the power source line; and
- a power source voltage supply circuit that supplies a power source voltage, and
- wherein the current consumption signal generation circuit is coupled between the power source supply terminal and the power source voltage supply circuit, and forms the analog signal in accordance with a current flowing in the power source supply terminal.

21. The electronic device according to claim 20,
- wherein the semiconductor device includes an analog/digital conversion circuit that converts the analog signal into a digital signal, and
- wherein the clock signal generation circuit includes a selection circuit which selects one of the clock signals having frequencies that are different from each other in accordance with the digital signal, and which supplies the selected clock signal to the processing circuit.

* * * * *